United States Patent [19]

Yamada et al.

[11] 4,432,076
[45] Feb. 14, 1984

[54] BIPOLAR STATIC SEMICONDUCTOR MEMORY DEVICE WITH A HIGH CELL HOLDING MARGIN

[75] Inventors: Katsuyuki Yamada, Kawasaki; Hideaki Isogai, Higashikurume, both of Japan

[73] Assignee: Fujitsu Limited, Kawasaki, Japan

[21] Appl. No.: 249,684

[22] Filed: Mar. 31, 1981

[30] Foreign Application Priority Data

Apr. 8, 1980 [JP] Japan .................................. 55-45826

[51] Int. Cl.³ .............................................. G11C 7/00
[52] U.S. Cl. ..................................... 365/190; 365/226
[58] Field of Search ................ 365/154, 155, 190, 226, 365/227

[56] References Cited

U.S. PATENT DOCUMENTS 3,781,828 12/1973 Platt et al. ........................... 365/227
4,322,820 3/1982 Toyoda ................................ 365/190

Primary Examiner—Stuart N. Hecker
Attorney, Agent, or Firm—Staas & Halsey

[57] ABSTRACT

This invention relates to a bipolar static type semiconductor memory device which reduces the influence of disturbances on the memory cells of non-selected chips and thereby obtains a large memory holding margin for the memory cells.

The semiconductor memory device of the present invention comprises flip-flop type circuit memory cells at the intersecting points of word lines and bit lines. The memory holding margin of the memory cells is increased by clamping the bit line voltage of the non-selected cells to a voltage higher than the bit line voltage of a selected chip being read.

5 Claims, 6 Drawing Figures

BIPOLAR STATIC SEMICONDUCTOR MEMORY DEVICE WITH A HIGH CELL HOLDING MARGIN

BACKGROUND OF THE INVENTION

This invention relates to a bipolar static semiconductor memory device, particularly to a semiconductor memory having improved protection for the stored contents.

To increase memory capacity, it is attempted to form a memory device by combining a plurality of semiconductor memory chips.

In this case, although a memory device provides a large capacity, only one chip is selected and a memory cell in such a selected chip is written into or read from. Other chips and memory cells are not selected. However, whether a chip is selected or not selected, an address is still applied to each chip, and the word line of a non-selected chip, corresponding to the selected word line of selected chip, becomes a high, H level. At this time, therefore, if noise occurs on the bit line, a erroneous writing may sometimes occur. Namely, in the case of the conventional static memory where each memory cell comprises a flip-flop circuit, the bit line voltage of a non-selected chip has been the same as the bit line voltage of the selected chip in the read operation and therefore the information in the cells of the non-selected chip is also read to the bit line.

At this timing, if a negative noise pulse appears on the bit line the transistor in the OFF condition, of the flip-flop type memory cell, turns ON. As a result, the transistor in the ON side may turn OFF, and the stored information in the cells may be destroyed.

Such noise may result from the noise of power supply line or signal lines due to, for example, a variation of input data and address signal appears on the bit lines.

For this reason, it is essential to prevent destruction of information stored in the cells of such a non-selected chip.

SUMMARY OF THE INVENTION

It is an object of the present invention to provide a semiconductor memory device which is capable of reducing the destruction of information stored in the cells of the static semiconductor memory device.

It is another object of the present invention to provide a semiconductor memory device which can reduce the influence of a disturbance on the memory cells of a non-selected chip and assure a high memory cell holding margin.

It is another object of the present invention to provide a semiconductor memory device having a simplified means to increase the memory cell holding margin.

These objects are, according to the present invention, achieved in a bipolar static type semiconductor memory device comprising memory cells of the flip-flop circuit structure at respective intersecting points of word lines and bit lines, thus characterized in providing a clamp means for clamping the bit line voltage, when a chip is non-selected to a voltage higher than the bit line voltage during the read operation when a chip is selected.

Further features and advantages of the present invention will be apparent from the ensuing description with reference to the accompanying drawings to which, however, the scope of the invention is in no way limited.

DETAILED DESCRIPTION OF THE PREFERRED EMBODIMENTS

Figure 1:
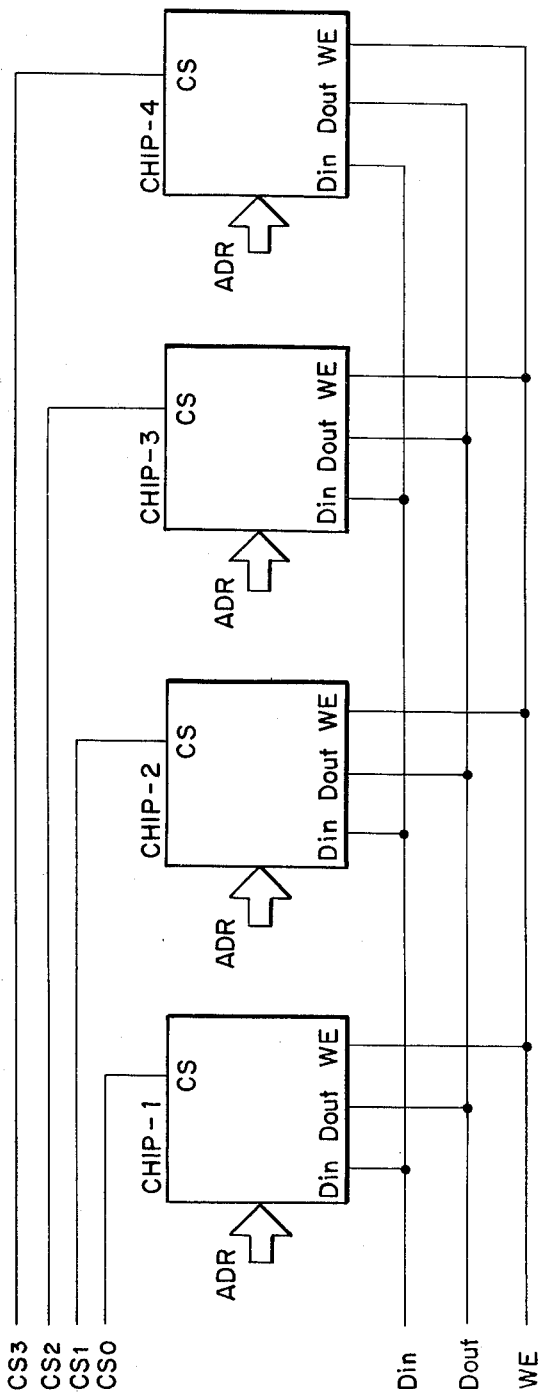
FIG. 1 illustrates an embodiment of a memory device using a plurality of semiconductor memory chips to which the present invention is applied.

FIG. 1 shows an embodiment of a memory device formed using four semiconductor chips. CHIPs-1 to 4 are the semiconductor memory chips and each chip provides the CS terminal for receiving the chip select signals $CS_0$ to $CS_3$, $D_{in}$ terminal for receiving the data signal $D_{in}$, WE terminal for receiving write enable signal WE and $D_{out}$ terminal for outputting the data output signal $D_{out}$.

The address signal ADR is applied to each chip. Since the address signal ADR is common to each chip, an address of one cell is designated in each chip, but only one chip, in accordance with the chip select signals $CS_0$ to $CS_3$, is selected, so that the input data signal $D_{in}$ is written and the output signal $D_{out}$ is read. Namely, the write operation of input data $D_{in}$ and the read operation of output signal are inhibitted by the chip select signal CS of the non-selected chips.

The present invention relates to a semiconductor memory chip suitable for use where a plurality of semiconductor memory chips are combined as shown in FIG. 1. Such semiconductor memory chip has improved circuits within the chip and assures high memory cell holding margin.

Figure 2:
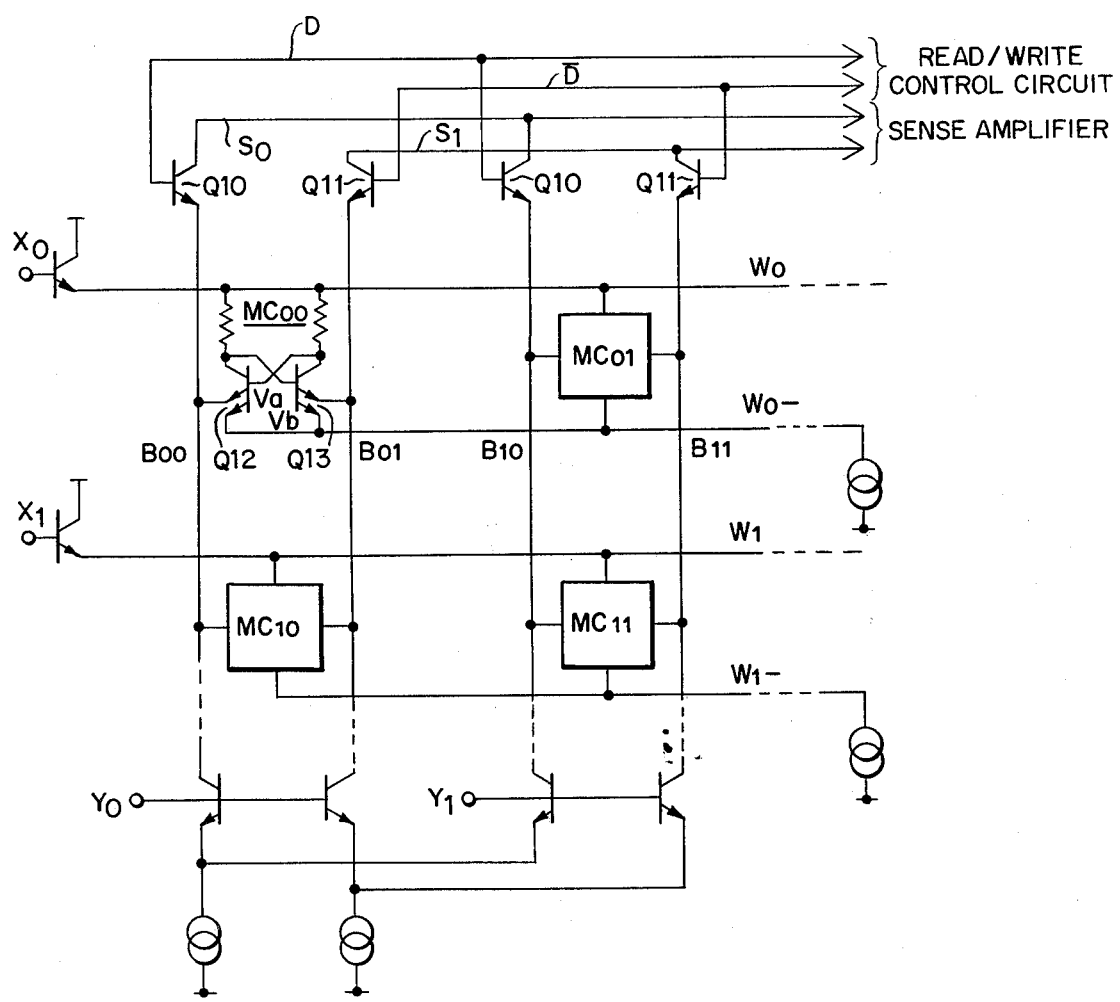
FIG. 2 is a schematic diagram of the memory area of a memory device indicated in the 1st embodiment of the present invention.
Figure 3:
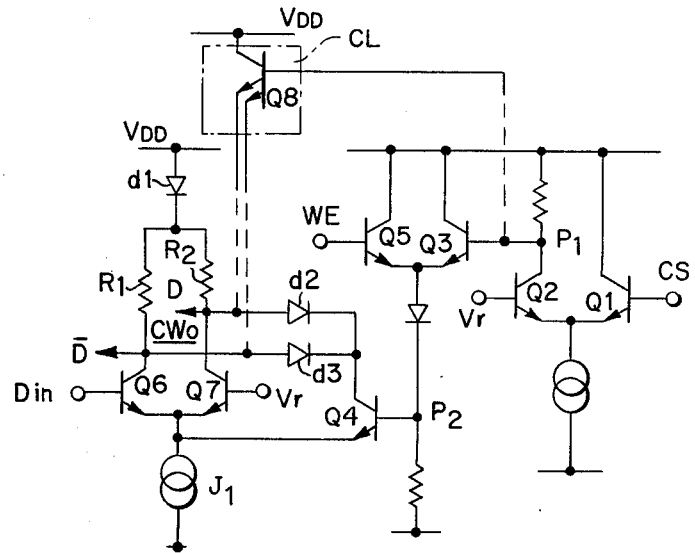
FIG. 3 is a circuit diagram of the READ/WRITE control circuit of the memory device comprising the 1st embodiment of the present invention.

FIG. 2 and FIG. 3 respectively show schematic diagrams indicating the structure of a static semiconductor memory obtained by incorporating an embodiment of the present invention. FIG. 2 shows the memory cell area, while FIG. 3 shows the READ/WRITE control circuit.

In this embodiment, it is the feature of this invention that the clamp circuit CL is added in FIG. 3, and the structure of the circuits of FIG. 2 and the other circuits of FIG. 3 are the same as in the conventional memory device. Therefore, the present invention will be explained in relation with the conventional structure.

Figure 4:
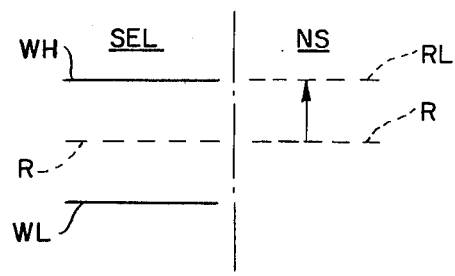
FIG. 4 illustrates the principle of the present invention.

In a conventional circuit structure, the read level (the base voltage in the case other than that when data is written into the transistor being connected to the bit line) is the same for the cases where the memory chip is selected or not selected. Namely, the bit line voltage of non-selected chips is the same as the bit line voltage of the selected chip during the read operation. FIG. 4 explains this relationship. In this figure, SEL indicates the case where a chip is selected, while NS indicates the case where a chip is not selected. WH means the H (high) write level corresponding, for example, to the data "1", while WL means the L (low) write level, in this example, corresponding to the data "0". The read level R is set at the center of WH and WL, and is held as it is even while a chip is not selected. FIG. 3 shows the READ/WRITE control circuit for generating these levels wherein when the chip is not selected, the chip selection signal CS becomes a H (high) level, the transistor $Q_1$ is ON, $Q_2$ is OFF, and the point $P_1$ H level. As a result, even if the write enable signal WE is a L (low) level which enables a write operation or a H (high) level which enables a read operation, the point $P_2$ is H level. Thus, the transistor $Q_4$ is ON, so that whether the input data signal $D_{in}$ is H or L, the data lines D, $\overline{D}$ are held at a constant level (R level in FIG. 4) which is determined by the power supply $V_{DD}$, diode $d_1$, resistors $R_1$ and $R_2$, diodes $d_2$ and $d_3$, transistor $Q_4$ and the constant current source $J_1$. When a chip is selected, CS is L level, therefore $Q_1$ is OFF, $Q_2$ is ON, and point $P_1$ is L level, so that the transistor $Q_5$ which receives the write enable signal WE, can be switched. Moreover, when the signal WE is a L level, $Q_4$ is OFF. Thus in accordance with the "H or L," level of $D_{in}$, namely data "1" or "0", the transistor $Q_6$ of the current switch $CW_0$ is turned ON or OFF, $Q_7$ is turned OFF or ON, and the lines D and $\overline{D}$ become H or L level, each per the levels WH and WL as in FIG. 4. When a chip is selected and a read operation starts, in other words, when WE is a H level, the point $P_2$ becomes a H level, transistor $Q_4$ is ON and the D, D lines are at the R level indicated above.

The lines D and D supply give the reference voltage to the read transistors $Q_{10}$, $Q_{11}$ inserted between the bit lines ($B_{00}$, $B_{10}$), ($B_{10}$, $B_{11}$) ... of FIG. 2. Namely, when the memory cell $MC_{00}$ is selected in FIG. 2, the read transistors $Q_{10}$, $Q_{11}$ connected to the bit lines $B_{00}$, $B_{01}$ form a current switch in combination with the transistors $Q_{12}$, $Q_{13}$ of the memory cell $MC_{00}$. In the read operation, when $Q_{12}$ is ON, $Q_{13}$ is OFF (at this time, $V_a$=H level, $V_b$=L level), $Q_{10}$ is OFF and $Q_{11}$ is ON (because $V_a>R$, $V_b<R$). Thus a current does not flow into the signal line $S_0$ of the sense amplifier and a current flows into the signal line $S_1$ of the sense amplifier. In contrast, when $Q_{12}$ is OFF and $Q_{13}$ is ON, the current flow in the $S_0$ and $S_1$ lines is reversed. Thus, the sense amplifier reads the stored condition "1" and "0" of the memory cell $MC_{00}$. For the write operation, for example, the transistor state of $Q_{12}$ which is now ON and $Q_{13}$ which is now OFF must be reversed (there is no change even if they are set in the same state) by setting the bit lines D to a H level, and $\overline{D}$ to a L level. Thus, the $Q_{10}$ is ON, $Q_{12}$ is OFF, $Q_{11}$ is OFF and $Q_{13}$ is ON.

In FIG. 2, the memory cells $MC_{10}$, $MC_{01}$, $MC_{11}$ ... are structured in the same way as the memory cell $MC_{00}$. In FIG. 2, $W_0$, $W_1$, ... are word lines, while $W_{0-}$, $W_{1-}$ ... are holding lines. The word line is selected when the X address selection signals $X_0$, $X_1$ ... become a H level. Moreover, the bit line pairs ($B_{00}$, $B_{10}$), ($B_{10}$, $B_{11}$) ... are selected when the Y address selection signals $Y_0$, $Y_1$, ... become a H level. In above explanation, only the memory cell $MC_{00}$ is selected and therefore only $X_0$, $Y_0$ are in the H level and other X address selection signals and Y address selection signals are all in the L level.

In such a static memory, even when a chip is not selected, a voltage is applied to the word lines $W_0$, $W_1$, ..., $W_{0-}$, $W_{1-}$, ... in order to hold the stored condition, and the one of the transistors corresponding to $Q_{12}$ and $Q_{13}$ of each memory cell is ON, while the other is OFF. Therefore, when the memory cell $MC_{00}$ is selected and the word line $W_0$ is a H level by any reason, if a negative noise pulse appears on the bit lines $B_{00}$, $B_{10}$, the OFF transistor will be turned ON and resultingly the ON transistor turned OFF. Namely, the stored information may be destroyed. Such noise often results from a change of input data and address signals.

The present invention is intended to improve the above disadvantage. In the embodiment of the present invention, it is conceived to reduce an influence of a noise disturbance on the memory cell and assure a large holding margin of the memory cells by making the read (R) level higher in the non-selected condition. More particularly the bit line clamp level than the read level R of the selecting condition, as indicated by RL in FIG. 4. The amount of increase in the read level in the non-selected condition is not limited, and it can simply be increased to the power supply voltage. It can be realized, for example, in FIG. 3 by providing the clamp circuit CL consisting of the transistor $Q_8$. Namely, when a chip is not selected, the transistor $Q_8$ clamps the D, $\overline{D}$ lines to the $V_{DD}$-$V_{BE}$ level because CS is a H level and $P_1$ is a H level (here $V_{BE}$ is the base-emitter voltage of transistor $Q_8$).

Figure 5:
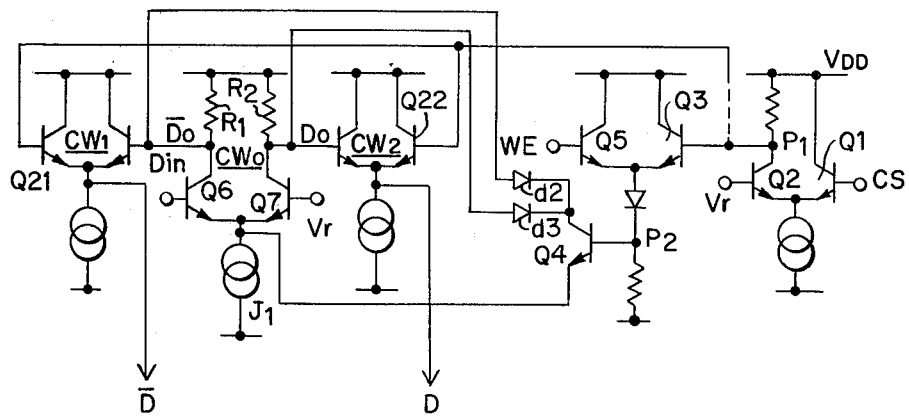
FIG. 5 is a circuit diagram of the READ/WRITE control circuit of the memory device comprising the 2nd embodiment of the present invention.

FIG. 5 shows the READ/WRITE control circuit based on another embodiment of the present invention. In this embodiment, the current switches $CW_1$, $CW_2$ are added to the conventional circuit structure and the other circuit portions closely corresponds to those of FIG. 3 (particularly, the diode $d_1$ used in FIG. 3 is omitted).

In this circuit, when CS=H level and the chip is non-selected, the point $P_1$ is a H level and transistors $Q_{21}$, $Q_{22}$ are ON. Thereby the base voltages of the transistors $Q_{10}$ and $Q_{11}$ inserted in the bit line of FIG. 2 are increased to almost the level of $V_{DD}$-$V_{BE}$ ($V_{BE}$ is a base-emitter voltage of $Q_{21}$ and $Q_{22}$). When a chip is selected, CS=L level, $P_1$=L level, $Q_{21}$, $Q_{22}$ are OFF and thereby the H and L levels of the output D, $\overline{D}$ are determined by "1" or "0" of the input data applied to the transistors $Q_{10}$, $Q_{11}$.

Figure 6:
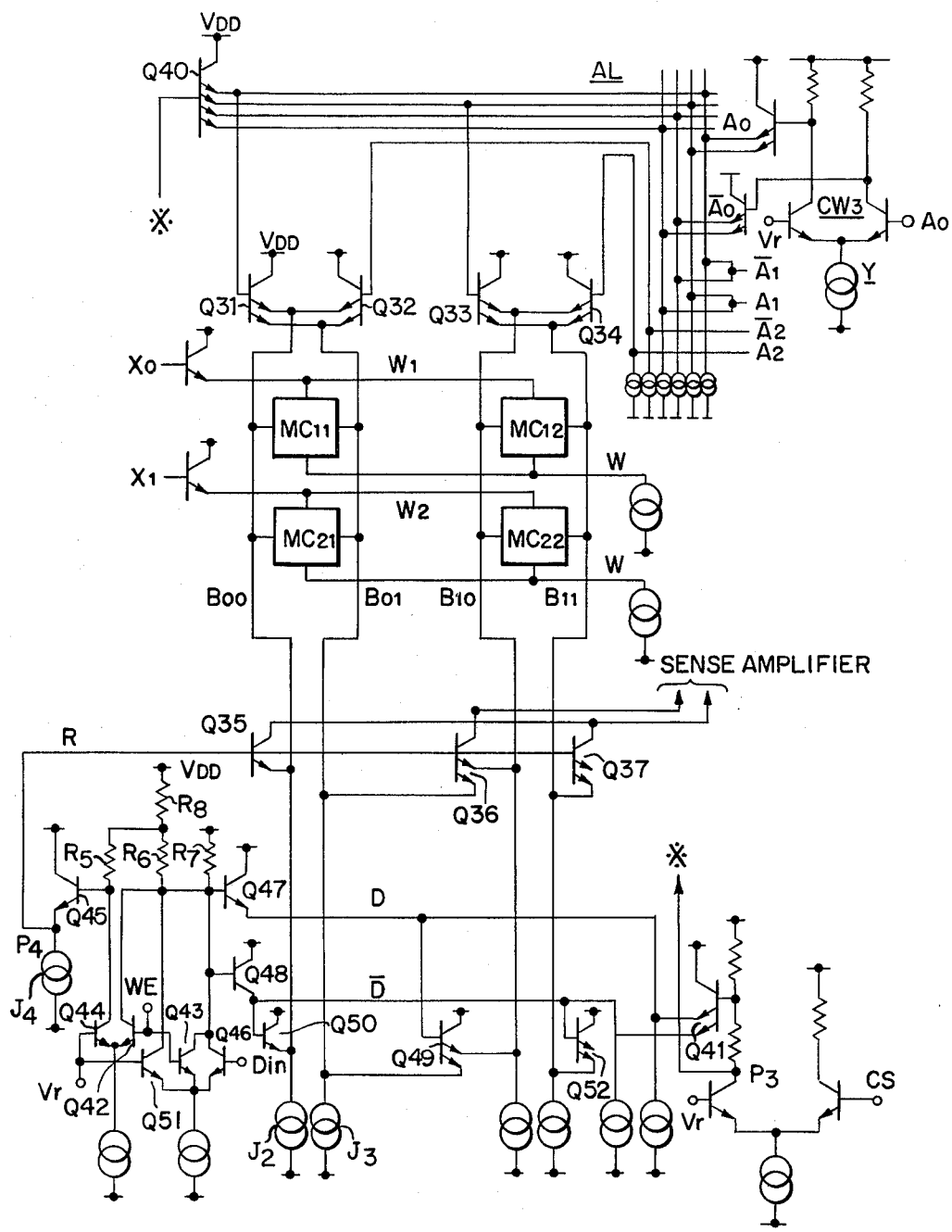
FIG. 6 is a circuit diagram of the memory device comprising the 3rd embodiment of the present invention.

FIG. 6 shows a further embodiment of the present invention.

$MC_{11}$ to $MC_{22}$ are memory cells which are selected by the word lines $W_1$, $W_2$ and bit line pairs $B_{00}$, $B_{01}$ and $B_{10}$, $B_{11}$. Of course, many word lines, bit lines and memory cells are provided. However, in FIG. 6, only four memory cells are indicated. In the case of the memory cells in FIG. 6, the word line is selected by the addresses $X_0$ and $X_1$, while the bit line is selected by the Y addresses $A_0$, $A_1$ and $A_2$. The current switch $CW_3$ generates $A_0$ and inverted $\overline{A_0}$. A similar circuit is also provided, although not illustrated, for the address bits $A_1$, $A_2$ and these are connected to the wiring AL. The transistors $Q_{31}$, $Q_{32}$... are inserted into the bit lines and the bases of these transistors are connected to the wiring AL and thus the relevant bit line becomes effective only when these are all OFF. The read transistors $Q_{35}$, $Q_{36}$, $Q_{37}$ are also connected to the bit lines and to the base of each is applied the read level. Thus, these transistors read the stored data by forming a current switch in combination with the ON transistor of the memory cell connected to the selected word line. For example, when $MC_{11}$ is selected and its left side is ON, $Q_{35}$ is OFF, while $Q_{36}$ is ON, thus a current does not flow into the one line of the sense amplifier but flows into the other line and thereby the sense amplifier SA can detect the stored content of the $MC_{11}$. But, when the transistors of bit line, $Q_{31}$ and $Q_{32}$ in this example, become ON, the bit lines $B_{00}$, $B_{01}$ are clamped to the voltage $V_{DD}$-2 $V_{BE}$, the current of the current sources $J_2$, $J_3$ are supplied from the $Q_{31}$, $Q_{32}$ and the sense amplifier SA can no longer detect the signal due to memory cell current. When the memory cells are selected in the manner as explained above, the read level in non-selecting condition can be increased by clamping all of the decoder lines AL to the H level when no chip is selected. Namely, in case no chip is selected, the chip select signal CS is H, and therefore the point $P_3$ becomes a H level. When this H level is applied to the base of a multi-emitter transistor $Q_{40}$ connected to the line AL, $Q_{40}$ becomes ON and resultingly the line AL becomes a H level and all of the transistors $Q_{31}$, $Q_{32}$, . . . are turned ON, clamping the bit line to the level of $V_{DD}$-2 $V_{BE}$.

In the case of this memory, the base voltage of read transistor $Q_{35}$ is generated by the circuit indicated in the lower left side of FIG. 6. In other words, when CS is a L level and $P_3$ is a L level the chip is selected and a read operation is carried out. Therefore, the transistor $Q_{41}$ is OFF, and WE is a H level and resultingly the transistors $Q_{42}$, $Q_{43}$ are ON, $Q_{44}$ is OFF and a voltage of emitter point $P_4$ of $Q_{45}$ increases toward $V_{DD}$. The voltage of the point $P_4$ at this time is the read level. During the write operation, WE is a L level, transistors $Q_{42}$, $Q_{43}$ are OFF, $Q_{44}$ is ON and $Q_{46}$, $Q_{51}$ *L are ON or OFF in accordance with the H or L levels of the input data signal $D_{in}$*. When $Q_{44}$ is ON, the point $P_4$ is a L level and the read transistors $Q_{35}$ to $Q_{37}$ are OFF and resultingly do not reflect the stored data. When the transistors $Q_{51}$, $Q_{46}$ are ON or OFF in accordance with the input data signal $D_{in}$, the transistors $Q_{47}$, $Q_{48}$ are respectively OFF or ON in accordance with the input data signal, switching the write transistors $Q_{49}$, $Q_{50}$ and $Q_{52}$. Namely, the output terminals of transistors $Q_{47}$, $Q_{48}$ become the D, $\overline{D}$ lines respectively, writing data into the memory cells.

Even when the memory has a large capacity, only one chip is selected and one memory cell within the selected chip is written or read. Other chips and memory cells are not selected at all. However, even if chips are not selected, an address is applied to each chip and the word line of non-selected chips corresponding to the selected word lines of selected chip becomes a H level. At this time, therefore, if a noise pulse appears on the bit line, an errorneous write may occur. In regard to this point, when all bit line level are clamped to the H level in the non-selected chips as in the case of the present invention, such errorneous writing can be prevented, effectively realizing safe and accurate protection of stored data.

We claim:

1. A bipolar static type semiconductor memory device having a read mode, select mode, and a non-select mode, comprising:
   word lines;
   bit lines respectively intersecting corresponding ones of said word lines;
   flip-flop circuit memory cells respectively, operatively connected to corresponding ones of the word lines and corresponding ones of the bit lines;
   clamp means for clamping, in response to the non-select mode, the voltage of the respective bit lines to a voltage higher than the voltage of the respective bit lines during the read operation while said bipolar static type semiconductor memory device is selected.

2. A semiconductor memory device as claimed in claim 1, further comprising read transistors, respectively, operatively connected to corresponding ones of said bit lines and to said clamp means,
   wherein said clamp means comprises first means for clamping the base voltages of said read transistors connected to said corresponding one of the bit lines.

3. A semiconductor memory device according to claim 2, wherein said device is operatively connected to receive a chip select signal, a write enable signal and a data input signal, and further comprises:
   of sense amplifiers, respectively, operatively connected to corresponding ones of said bit lines, and wherein said respective or said read transistors are operatively connected between said corresponding ones of said bit lines and said respective sense amplifiers, and wherein said clamp means further comprises second means, operatively connected to said first means, for receiving said chip select signal and for placing said device in said select mode in accordance with said chip select signal;
   third means operatively connected to said first means, for receiving said write enable signal and said data input signal, and for placing said device in said read mode in accordance with said write enable signal, said first means including means for clamping the base voltages of said read transistors in response to said device being in said non-select mode, and said first means being responsive to said write enable signal and to said data signal in response to said device being in said select mode.

4. A semiconductor memory device as claimed in claim 1, wherein said device is operatively connected to receive a power supply voltage, and further comprises bit line selection control transistors, respectively, operatively connected between said power supply voltage and a corresponding one of said bit lines and to said clamp means, wherein said clamp means comprises first means for clamping the base voltages of said selection control transistors connected to said corresponding one the bit lines.

5. The semiconductor memory device as claimed in claim 4, wherein said device is operatively connected to receive a chip select signal, a write enable signal and a data signal, and further comprises:
   second means, operatively connected to said clamp means, for receiving said chip select signal and for placing said semiconductor memory device in said select mode in accordance with said chip select signal;
   third means, operatively connected to said clamp means, for receiving said write enable signal, and for placing said semiconductor memory device in said read mode in accordance with said write enable signal,
   wherein said first means comprises at least one current switch operatively connected to receive said data signal and operatively connected between a corresponding one of said selection control transistors and said second and third means, said current switch clamping the base voltages of said selection control transistors in response to said semiconductor memory device being in said non-select mode and said current switch responsive to said data signal and to said write enable signal in response to said semiconductor memory device in said select mode.

* * * * *

UNITED STATES PATENT AND TRADEMARK OFFICE
CERTIFICATE OF CORRECTION

PATENT NO. : 4,432,076

DATED : February 14, 1984

INVENTOR(S) : YAMADA ET AL.

It is certified that error appears in the above-identified patent and that said Letters Patent is hereby corrected as shown below:

Column 3, line 29, "D,D" should be --D,$\bar{D}$--;
         line 31, "D supply give" should be --$\bar{D}$ supply--.
Column 4, line 14, after "particularly" insert --,--; after "level" insert --is to be higher--.
Column 5, lines 27-28, the italicized words should be regular print.

Signed and Sealed this

Thirtieth Day of April 1985

[SEAL]

Attest:

DONALD J. QUIGG

Attesting Officer     Acting Commissioner of Patents and Trademarks